(12) United States Patent
Lang et al.

(10) Patent No.: US 7,381,451 B1
(45) Date of Patent: Jun. 3, 2008

(54) STRAIN ENGINEERING—HDP THIN FILM WITH TENSILE STRESS FOR FEOL AND OTHER APPLICATIONS

(75) Inventors: Chi-i Lang, Sunnyvale, CA (US); Ratsamee Limdulpaiboon, Daly City, CA (US); Cayetano Gonzalez, San Jose, CA (US)

(73) Assignee: Novellus Systems, Inc., San Jose, CA (US)

(*) Notice: Subject to any disclaimer, the term of this patent is extended or adjusted under 35 U.S.C. 154(b) by 449 days.

(21) Appl. No.: 10/991,890

(22) Filed: Nov. 17, 2004

(51) Int. Cl.
*H05H 1/24* (2006.01)
*B05D 3/02* (2006.01)
*H05H 1/02* (2006.01)

(52) U.S. Cl. .................. 427/569; 427/372.2; 427/574; 427/579

(58) Field of Classification Search ............ None
See application file for complete search history.

(56) References Cited

U.S. PATENT DOCUMENTS

| | | |
|---|---|---|
| 4,361,461 A | 11/1982 | Chang |
| 5,129,958 A | 7/1992 | Nagashima et al. |
| 5,227,191 A | 7/1993 | Nagashima |
| 5,246,885 A | 9/1993 | Braren et al. |
| 5,252,178 A | 10/1993 | Moslehi |
| 5,270,264 A | 12/1993 | Andideh et al. |
| 5,282,925 A | 2/1994 | Jeng et al. |
| 5,342,801 A | 8/1994 | Perry et al. |
| 5,385,857 A | 1/1995 | Solo de Zaldivar |
| 5,494,854 A | 2/1996 | Jain |
| 5,516,729 A | 5/1996 | Dawson et al. |
| 5,532,516 A | 7/1996 | Pasch et al. |
| 5,621,241 A | 4/1997 | Jain |
| 5,622,894 A | 4/1997 | Jang et al. |
| 5,636,320 A | 6/1997 | Yu et al. |
| 5,641,545 A | 6/1997 | Sandhu |
| 5,702,982 A | 12/1997 | Lee et al. |

(Continued)

FOREIGN PATENT DOCUMENTS

JP 2003-031649 1/2003

OTHER PUBLICATIONS

Peter Singer, "New Materials and Designs to Improve Transistor Performance", Apr. 1, 2004, Semiconductor International.

(Continued)

*Primary Examiner*—Timothy Meeks
*Assistant Examiner*—Kelly M Stouffer
(74) *Attorney, Agent, or Firm*—Weaver Austin Villeneuve & Sampson LLP

(57) ABSTRACT

High density plasma (HDP) techniques form high tensile stress silicon oxide films. The HDP techniques use low enough temperatures to deposit high tensile stress silicon oxide films in transistor architectures and fabrication processes effective for generating channel strain without adversely impacting transistor integrity. Methods involve a two phase process: a HDP deposition phase, wherein silanol groups are formed in the silicon oxide film, and a bond reconstruction phase, wherein water is removed and tensile stress is induced in the silicon oxide film. Transistor strain can be generated in NMOS or PMOS devices using strategic placement of the high tensile stress silicon oxide. Example applications include high tensile stress silicon oxides for use in shallow trench isolation structures, pre-metal dielectric layer and silicon on insulator substrates.

35 Claims, 8 Drawing Sheets

U.S. PATENT DOCUMENTS

| | | | |
|---|---|---|---|
| 5,705,419 | A | 1/1998 | Perry et al. |
| 5,711,998 | A | 1/1998 | Shufflebotham |
| 5,789,818 | A | 8/1998 | Havermann |
| 5,834,068 | A | 11/1998 | Chern et al. |
| 5,851,344 | A | 12/1998 | Xu et al. |
| 5,858,876 | A | 1/1999 | Chew |
| 5,869,902 | A | 2/1999 | Lee et al. |
| 5,872,058 | A | 2/1999 | Van Cleemput et al. |
| 5,897,370 | A | 4/1999 | Joshi et al. |
| 5,910,020 | A | 6/1999 | Yamada |
| 5,911,113 | A | 6/1999 | Yao et al. |
| 5,913,140 | A | 6/1999 | Roche et al. |
| 5,920,792 | A | 7/1999 | Lin |
| 5,937,323 | A | 8/1999 | Qrezyk et al. |
| 5,953,635 | A | 9/1999 | Andideh |
| 5,962,923 | A | 10/1999 | Xu et al. |
| 5,963,840 | A | 10/1999 | Xia et al. |
| 5,968,610 | A | 10/1999 | Liu et al. |
| 5,972,192 | A | 10/1999 | Dubin et al. |
| 6,027,663 | A | 2/2000 | Martin et al. |
| 6,030,881 | A | 2/2000 | Papasouliotis et al. |
| 6,037,018 | A | 3/2000 | Jang et al. |
| 6,077,451 | A | 6/2000 | Takenaka et al. |
| 6,077,574 | A | 6/2000 | Usami |
| 6,100,205 | A | 8/2000 | Liu et al. |
| 6,106,678 | A | 8/2000 | Shufflebotham et al. |
| 6,124,211 | A | 9/2000 | Butterbaugh et al. |
| 6,136,703 | A | 10/2000 | Vaartstra |
| 6,149,779 | A | 11/2000 | Van Cleemput |
| 6,184,158 | B1 | 2/2001 | Shufflebotham et al. |
| 6,200,412 | B1 | 3/2001 | Kilgore et al. |
| 6,211,065 | B1 | 4/2001 | Xi et al. |
| 6,232,196 | B1 | 5/2001 | Raaijmakers et al. |
| 6,265,269 | B1 | 7/2001 | Chen et al. |
| 6,277,764 | B1 | 8/2001 | Shin et al. |
| 6,331,494 | B1 | 12/2001 | Olson et al. |
| 6,335,261 | B1 | 1/2002 | Natzle et al. |
| 6,395,150 | B1 | 5/2002 | Van Cleemput et al. |
| 6,400,023 | B2 | 6/2002 | Huang |
| 6,410,446 | B1 | 6/2002 | Tsai et al. |
| 6,451,705 | B1 | 9/2002 | Trapp et al. |
| 6,479,361 | B1 | 11/2002 | Park |
| 6,479,396 | B1 | 11/2002 | Xu et al. |
| 6,486,081 | B1 | 11/2002 | Ishikawa et al. |
| 6,500,728 | B1 | 12/2002 | Wang |
| 6,531,377 | B2 | 3/2003 | Knorr et al. |
| 6,566,229 | B2 | 5/2003 | Hong et al. |
| 6,569,777 | B1 | 5/2003 | Hsu et al. |
| 6,596,653 | B2 * | 7/2003 | Tan et al. .................. 438/788 |
| 6,596,654 | B1 | 7/2003 | Bayman et al. |
| 6,599,829 | B2 | 7/2003 | Smith et al. |
| 6,617,207 | B1 | 9/2003 | Kiryu et al. |
| 6,642,105 | B2 | 11/2003 | Kim et al. |
| 6,706,541 | B1 | 3/2004 | Toprac et al. |
| 6,737,334 | B2 | 5/2004 | Ho et al. |
| 6,787,483 | B1 | 9/2004 | Bayman et al. |
| 6,794,290 | B1 | 9/2004 | Papasouliotis et al. |
| 6,808,748 | B2 | 10/2004 | Kapoor et al. |
| 6,812,043 | B2 | 11/2004 | Bao et al. |
| 6,821,905 | B2 | 11/2004 | Pan et al. |
| 6,846,391 | B1 | 1/2005 | Papasouliotis et al. |
| 6,846,745 | B1 | 1/2005 | Papasouliotis et al. |
| 6,852,639 | B2 | 2/2005 | Rudolph et al. |
| 6,867,086 | B1 | 3/2005 | Chen et al. |
| 6,903,031 | B2 | 6/2005 | Karim et al. |
| 6,958,112 | B2 | 10/2005 | Karim et al. |
| 7,001,854 | B1 | 2/2006 | Papasouliotis et al. |
| 7,067,440 | B1 * | 6/2006 | Bayman et al. ............. 438/788 |
| 7,078,312 | B1 | 7/2006 | Sutanto et al. |
| 7,122,485 | B1 | 10/2006 | Papasouliotis et al. |
| 7,135,409 | B2 | 11/2006 | Komagata |
| 7,148,155 | B1 * | 12/2006 | Tarafdar et al. ............ 438/778 |
| 7,163,896 | B1 | 1/2007 | Zhu et al. |
| 7,176,039 | B1 | 2/2007 | Papasouliotis et al. |
| 7,211,525 | B1 | 5/2007 | Shanker et al. |
| 7,217,658 | B1 | 5/2007 | Bayman et al. |
| 2001/0019903 | A1 | 9/2001 | Shufflebotham et al. |
| 2001/0044203 | A1 | 11/2001 | Huang et al. |
| 2002/0052119 | A1 | 5/2002 | Van Cleemput |
| 2002/0084257 | A1 | 7/2002 | Bjorkman et al. |
| 2002/0179570 | A1 | 12/2002 | Mathad et al. |
| 2002/0187657 | A1 * | 12/2002 | Morozumi .................. 438/789 |
| 2003/0003244 | A1 | 1/2003 | Rossman |
| 2003/0003682 | A1 | 1/2003 | Moll et al. |
| 2003/0087506 | A1 | 5/2003 | Kirchhoff |
| 2003/0165632 | A1 | 9/2003 | Lin et al. |
| 2003/0203652 | A1 | 10/2003 | Bao et al. |
| 2003/0207580 | A1 | 11/2003 | Li et al. |
| 2004/0020894 | A1 | 2/2004 | Williams et al. |
| 2004/0058549 | A1 | 3/2004 | Ho et al. |
| 2004/0082181 | A1 | 4/2004 | Doan et al. |
| 2004/0110390 | A1 | 6/2004 | Takagi et al. |
| 2004/0241342 | A1 | 12/2004 | Karim et al. |
| 2005/0074946 | A1 | 4/2005 | Chu et al. |
| 2005/0130411 | A1 | 6/2005 | Bao et al. |
| 2005/0136576 | A1 | 6/2005 | Ishihara et al. |
| 2005/0136686 | A1 | 6/2005 | Kim et al. |
| 2005/0250346 | A1 | 11/2005 | Schmitt |

OTHER PUBLICATIONS

Ghani et al, "A 90nm High Volume Manufacturing Logic Technology Featuring Novel 45nm Gate Length Strained Silicon CMOS Transistors", IEEE, © 2003.

Varadarajan, et al., "Strained Transistor Architecture and Method", Novellus Systems, Inc., U.S. Appl. No. 10/923,259, filed Aug. 20, 2004, pp. 1-24.

U.S. Office Action mailed May 16, 2007, from U.S. Appl. No. 11/159,834.

Notice of Allowance mailed Dec. 13, 2007, from U.S. Appl. No. 11/159,834.

Allowed Claims from U.S. Appl. No. 11/159,834.

U.S. Office Action mailed Aug. 6, 2003, from U.S. Appl. No. 10/058,897.

U.S. Office Action mailed Jan. 29, 2004, from U.S. Appl. No. 10/058,897.

U.S. Office Action mailed May 21, 2004, from U.S. Appl. No. 10/058,897.

U.S. Office Action mailed Aug. 10, 2004, from U.S. Appl. No. 10/271,333.

U.S. Office Action mailed Apr. 14, 2005, from U.S. Appl. No. 10/271,333.

U.S. Office Action mailed Jun. 29, 2005, from U.S. Appl. No. 10/728,569.

Papasouliotis et al., "Hydrogen-Based Phosphosilicate Glass Process for Gap Fill of High Aspect Ratio Structures", Novellus Systems, Inc., filed Oct. 11, 2002, U.S. Appl. No. 10/271,333, pp. 1-28.

Guari et al., "Method of Preventing Structures Erosion During Multi-Step Gap Fill", Novellus Systems, Inc., filed Dec. 4, 2003, U.S. Appl. No. 10/728,569, pp. 1-29.

U.S. Office Action mailed Jan. 7, 2005, from U.S. Appl. No. 10/728,569.

U.S. Office Action mailed Nov. 6, 2002, from U.S. Appl. No. 09/996,619.

U.S. Office Action mailed Mar. 2, 2004, from U.S. Appl. No. 10/442,846.

Bayman et al., "Gap Fill For High Aspect Ratio Structures", Novellus Systems, Inc., filed Jul. 13, 2004, U.S. Appl. No. 10/890,655, pp. 1-24.

U.S. Office Action mailed Jul. 25, 2005, from U.S. Appl. No. 10/890,655.

U.S. Office Action mailed Apr. 30, 2004, from U.S. Appl. No. 10/389,164.

Sutanto et al., "Method For Controlling Etch Process Repeatability", Novellus Systems, Inc., filed Sep. 2, 2003, U.S. Appl. No. 10/654,113, pp. 1-31.

U.S. Office Action mailed Jun. 17, 2004, from U.S. Appl. No. 10/654,113.

U.S. Office Action mailed Dec. 2, 2004, from U.S. Appl. No. 10/654,113.

U.S. Office Action mailed Mar. 31, 2005, from U.S. Appl. No. 10/654,113.

Bayman et al., "Process Modulation to Prevent Structure Erosion During Gap Fill", Novellus Systems, Inc., filed Sep. 7, 2004, U.S. Appl. No. 10/935,909, pp. 1-30.

Papasouliotis et al., "Dynamic Modification of Gap-Fill Process Characteristics", Novellus Systems, Inc., filed Sep. 21, 2004, U.S. Appl. No. 10/947,424, pp. 1-25.

Hook et al., "The Effects of Fluorine on Parametrics and Reliability in a 0.18-µm 3.5/6.8 nm Dual Gate Oxide CMOS Technology", IEEE Transactions on Electron Devices, vol. 48, No. 7., Jul. 2001, pp. 1346-1353.

Shanker et al., "Hydrogen Treatment Enhanced Gap Fill", Novellus Systems, Inc., filed Mar. 16, 2005, U.S. Appl. No. 11/082,369, pp. 1-33.

Papasoulitotis et al., "Deposition Profile Modification Through Process Chemistry", Novellus Systems, Inc., filed Dec. 9, 2002, U.S. Appl. No. 10/316,987, pp. 1-35.

U.S. Office Action mailed Jan. 27, 2005, from U.S. Appl. No. 10/316,987.

U.S. Office Action mailed Jul. 14, 2005, from U.S. Appl. No. 10/316,987.

Zhu et al., "Biased $H_2$ Etch Process In Deposition-Etch-Deposition Gap Fill", Novellus Systems, Inc., filed Dec. 10, 2003, U.S. Appl. No. 10/733,858, pp. 1-28.

U.S. Office Action mailed Apr. 19, 2005, from U.S. Appl. No. 10/733,858.

U.S. Office Action mailed Oct. 7, 2005, from U.S. Appl. No. 10/733,858.

Lang et al., "Helium-Based Etch Process in Deposition-Etch-Deposition Gap Fill", Novellus Systems, Inc., filed Jun. 22, 2005, U.S. Appl. No. 11/159,834, pp. 1-29.

U.S. Office Action mailed Nov. 17, 2005, from U.S. Appl. No. 10/316,987.

U.S. Office Action mailed Oct. 18, 2005, from U.S. Appl. No. 10/947,424.

Lang et al., "Using Water (H20) To Replace Oxygen (02) In A Silicon Dioxide (Si02) Thin Film Deposition Process for HDP STI Technology", Novellus Systems, Inc., filed Nov. 9, 2005, U.S. Appl. No. 11/272,487, pp. 1-25.

U.S. Office Action mailed Dec. 14, 2005, from U.S. Appl. No. 10/728,569.

Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.

U.S. Office Action mailed Feb. 16, 2006, from U.S. Appl. No. 11/082,369.

U.S. Office Action mailed Mar. 24, 2006, from U.S. Appl. No. 10/733,858.

U.S Office Action mailed Jun. 1, 2006, from U.S. Appl. No. 10/728,569.

U.S. Office Action mailed Apr. 19, 2006, from U.S. Appl. No. 10/947,424.

U.S Office Action mailed Sep. 29, 2006, from U.S. Appl. No. 11/082,369.

U.S. Office Action mailed Oct. 2, 2006, from U.S. Appl. No. 10/935,909.

Yu et al., "Stress Profile Modulation in STI Gap Fill," Novellus Systems, Inc., U.S. Appl. No. 11/471,958, filed Jun. 20, 2006, pp. 1-27.

U.S. Office Action mailed May 16, 2007, from U.S. Appl. No. 11/159,834.

* cited by examiner

STRAIN ENGINEERING—HDP THIN FILM WITH TENSILE STRESS FOR FEOL AND OTHER APPLICATIONS

FIELD OF THE INVENTION

This invention relates to high density plasma (HDP) deposition techniques for forming silicon oxide films. More specifically, the invention relates to providing a high tensile stress silicon oxide film using HDP methods. The methods can be used to deposit high tensile stress silicon oxide films in transistor architectures to generate channel strain.

BACKGROUND

As transistors are scaled to smaller dimensions there is a need for higher switching speeds. One solution to increase transistor speed is to strain the silicon in the channel. Adding a small amount of strain to the silicon lattice structure promotes higher electron and hole mobilities, which increase transistor drain current and device performance.

When the lattice is under tensile strain, its physical symmetry is broken, and with it the electronic symmetry. The lowest energy level of the conduction band is split, with two of the six original states dropping to a lower energy level and four rising to a higher energy level. This renders it more difficult for the electrons to be 'scattered' between the lowest energy states by a phonon, because there are only two states to occupy. Whenever electrons scatter, it randomizes their motion. Reducing scatter increases the average distance an electron can travel before it is knocked off course, increasing its average velocity in the conduction direction. Also, distorting the lattice through tensile strain can distort the electron-lattice interaction in a way that reduces the electron's effective mass, a measure of how much it will accelerate in a given field. As a result, electron transport properties like mobility and velocity are improved and channel drive current for a given device design is increased in a strained silicon channel, leading to improved transistor performance.

High tensile films have recently been introduced to the transistor device manufacturing process. For example, highly tensile silicon nitride capping layers have been used in NMOS structures to induce tensile strain in the NMOS channel region. The stress from this capping layer is uniaxially transferred to the NMOS channel through the source-drain regions to create tensile strain in NMOS channel. However, highly tensile silicon nitride capping layers are generally deposited using thermal CVD processes, which may consume too much of thermal budget for advanced transistor architectures. In addition, silicon nitride capping layers are not appropriate for use in PMOS structures where it is preferable to have compressive strain in the PMOS channel region.

Accordingly, new transistor architectures and fabrication processes for generating channel strain are needed.

SUMMARY OF THE INVENTION

The present invention addresses this need by providing methods for forming highly tensile stress silicon oxide films using high density plasma (HDP) CVD techniques. The methods can be used to deposit highly tensile stress silicon oxide films in transistor architectures for generating channel strain without adversely impacting the efficiency of the transistor fabrication process. In preferred embodiments, the methods involve at least a two-phase process: a deposition phase (first phase) and a bond reconstruction phase (second phase). In the first phase, a substrate is preferably exposed to a high density plasma using at least a silicon-containing precursor, an oxygen source and a hydrogen source while maintaining a substrate temperature of no greater than about 400° C. to form a silicon oxide film comprising silanol groups on the substrate. In the second phase, the silicon oxide film is treated to remove water from the silicon oxide film to induce tensile stress in the silicon oxide film.

In one aspect, the invention is used to produce silicon oxide film used as a dielectric in front-end-of-line (FEOL) applications such as shallow trench isolation (STI), and/or pre-metal dielectric (PMD) and/or silicon-on-insulator (SOI) layer applications in an integrated circuit device. In many of the FEOL applications, the silicon oxide film is deposited to a thickness of between about 2,000 Angstroms and about 7,000 Angstroms. The tensile stress of the silicon oxide film produced using methods of the invention will preferably be about 1E8 dynes/cm$^2$ or greater, more preferably in about the 1E8 to 1E10 dynes/cm$^2$ range.

In the deposition phase, in preferred embodiments the silicon-containing precursor is a silane, such as $SiH_4$ or $Si_2H_4$. In some cases, the oxygen source is $O_2$ and the hydrogen source is $H_2$. In other cases, water is used as the oxygen source and hydrogen source. Sometimes water is used in combination with $O_2$ and/or $H_2$. In preferred embodiments where $SiH_4$ and $O_2$ are used, the $SiH_4$ to $O_2$ ratio ($SiH_4$:$O_2$) is between about 1:4 and about 2:3. Other gases may also be introduced to high density plasma, including one or more inert gases.

Also in the deposition phase, the substrate temperature is preferably between about 25 and about 400° C., more preferably between about 200 and about 250° C. For a typical deposition, the substrate is exposed to the high density plasma for less than about 420 seconds. The high frequency and low frequency power will vary depending in large part on the substrate size and source gases. In embodiments where the substrate is a 200 mm or 300 mm wafer, the high frequency power is preferably no greater than about 8,000 Watts and a low frequency power is preferably no greater than about 8,000 Watts. In another embodiment, the substrate is a 200 mm wafer, the silicon-containing precursor is $SiH_4$, the high frequency power is preferably no greater than about 2000 Watts and a low frequency power is preferably no greater than about 5000 Watts. Generally, the high frequency power to low frequency power ratio is preferably between about 1:3 and about 2:3. Additionally in the deposition phase, the proximity of the substrate to the top of the HDP apparatus dome is between about 5 inches and about 10 inches for a 200 mm wafer and between about 8 inches and about 14 inches for a 300 mm wafer. As one specific example using a Novellus Speed™ HDP reactor, this generally corresponds to the pedestal height being more than about 1.35 inches from the gas ring.

In the bond reconstruction phase, the treatment to remove water is preferably a high density plasma treatment or a thermal treatment. If a high density plasma treatment is used, the substrate temperature is preferably between about 300° C. and about 600° C. In one embodiment where a 200 mm wafer was used, the high density plasma treatment uses a low frequency power between about 7000 and about 8000 Watts, and the high frequency power is off. The high density plasma treatment time will vary depending largely upon plasma power and substrate temperature. The high plasma treatment may include the use of an inert gas such as helium. In preferred embodiments, the substrate temperature typically ranges between about 300° C. and about 600° C.

If a thermal treatment is use in the bond reconstruction phase, the substrate is heated to a temperature typically ranging between about 300° C. and about 1000° C. The thermal treatment preferably occurs in an inert environment, such as in vacuum condition or in the presence of an inert gas. In some cases, the thermal treatment occurs in the presence of a non-reducing gas such as nitrogen. The thermal treatment preferably occurs for less than about 2 hours, for example less than 1 hour.

These and other aspects and advantages of the invention are described further below and with reference to the drawings.

DETAILED DESCRIPTION OF THE INVENTION

Figure 1:
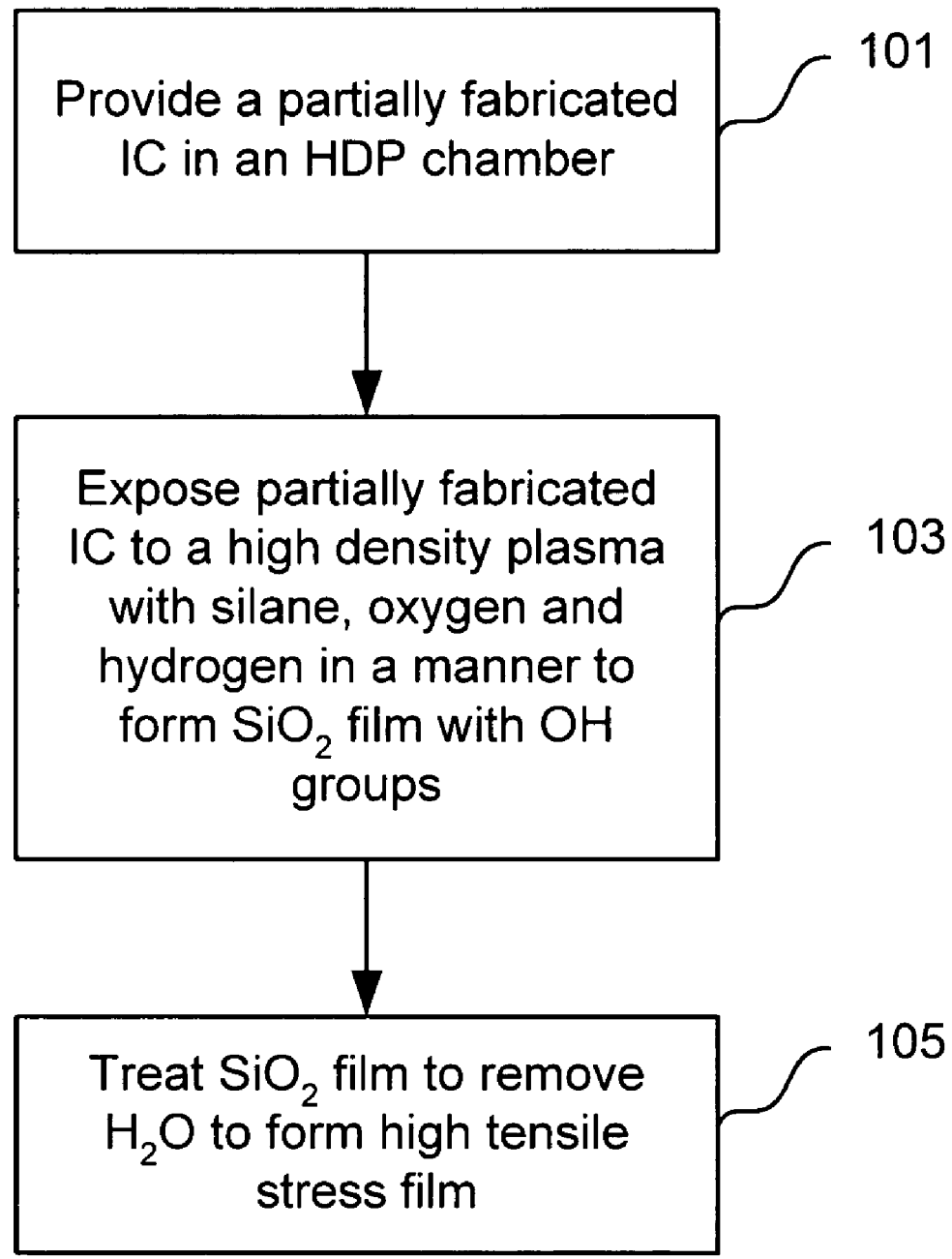
FIG. 1 is a flowchart summarizing stages of a general process and a preferred implementation of the invention for forming high tensile silicon oxide films.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

As described previously, methods of the invention can be used to produce high tensile stress oxide films useful in semiconductor wafer fabrication, especially in applications for improving strained transistor architectures. Some specific example transistor applications are described below with reference to FIGS. 5A-5C. Methods of the invention, however, are not limited to these transistor applications, or any other particular application. Note that to the extent that the invention applies to semiconductor wafer fabrication, the words "wafer", "wafer substrate" and "substrate" will be used interchangeably and the words "film" and "layer" will be used interchangeably herein.

The present invention relates to high density plasma chemical vapor deposition (HDP-CVD or HDP) techniques for providing high tensile stress silicon oxide films. Methods of the invention are especially useful in front-end-of-line (FEOL) processes in semiconductor wafer fabrication. Examples applications include dielectric gap fill applications such as shallow-trench isolation (STI) structures and pre-metal dielectric (PMD) layers, as well as silicon-on-insulator (SOI) dielectric applications.

HDP techniques are typically the method of choice for many gap fill deposition applications because they can provide void-free high-quality dielectric films, even in high aspect ratio device structures. The basis for the improved gap filling capability is that HDP sources can provide a high density of low energy ions to the wafer surface. The ions can simultaneously sputter the film during CVD deposition. The sputtering can remove material from some regions on the wafer surface more rapidly than other regions, resulting in films that can fill narrow gaps with no voids.

HDP methods are not only used in gap filling depositions. In many traditional HDP applications, gap fill or otherwise, silicon oxide films are deposited with the goal of attaining dense films. Unlike other deposition processes, HDP techniques can be used to produce dense films. For example, HDP methods can produce silicon oxide films as dense as thermally deposited silicon oxide. These dense films can be produced because the ion bombardment aspect of HDP has the effect of densifying growing film. Any voids formed on the surface regions of the film during deposition are forced out by the energy of the bombarding ions. With densification comes compressive stress. Compressive stress is created by the compaction of the silicon oxide network of the film.

Methods of the present invention focus on using HDP methods to produce silicon oxide films with high tensile stress. In contrast to compressive stress, tensile stress is the stress state of a material leading to expansion of the internal atomic network. For silicon oxide films, tensile stress leads to the expansion of the silicon oxide network. However, since HDP methods are used to deposit the film, the densifying effects of the high density plasma still produce a relatively dense film compared to films produced using standard CVD or PECVD deposition techniques. Thus, the present invention allows one to produce relatively dense silicon oxide films that possess high tensile stress.

Tensile and compressive stress can be measured in force divided by units of area, usually dynes/cm$^2$ or N/cm$^2$, and are well defined within the art and will not be discussed in detail herein. Any suitable method for measuring tensile stress may be used. For example, standards for measuring compressive and tensile stress of materials described by the American Society for Testing and Materials (ASTM) may be used. Measures of tensile stress presented herein may be made with any suitable apparatus including a KLA-Tencor Flix or FSM stress gauge device.

Methods of the invention are used to produce high tensile, high quality silicon oxide films. Other doped silicon-based films such as phosphosilicate glass (PSG) and fluorosilicate glass (FSG) films are typically deposited using CVD or PECVD methods and do not possess the high quality of HDP deposited silicon oxide films. Methods of the invention are generally not used to form these types of doped silicon-based films.

The present invention utilizes a two-phase process to form the high tensile stress silicon oxide films. The two-phase process allows for modulation of the stoichiometric structure of the silicon oxide network. In the first phase, a HDP method is used to deposit a silicon oxide film comprising hydroxyl (—OH) groups, more specifically, silanol (Si—OH) groups. In the second phase, the deposited silicon oxide film is treated to remove at least water from and reconstruct bonds within the film, thereby inducing tensile stress in the film.

In most traditional applications, hydroxyl groups are considered impurities within a silicon oxide film and are generally discouraged. That is, conventionally, it is believed that the incorporation of hydroxyl groups can weaken the silicon oxide structure, resulting in poorer quality oxides. More specifically, in a typical silicon oxide deposition process, the following reaction is preferred:

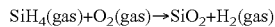

Thus, in a typical silicon oxide deposition, silane ($SiH_4$) combines with oxygen ($O_2$) to form a silicon dioxide ($SiO_2$) film and hydrogen gas ($H_2$).

In contrast, for methods of the present invention, it is preferable that some hydroxyl groups are incorporated within the silicon oxide film. For example, if $SiH_4$, $O_2$, and $H_2$ are used, the following reactions will preferably occur in the deposition phase (phase 1) and the water removal phase (phase 2):

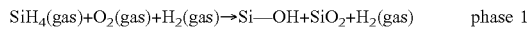 phase 1

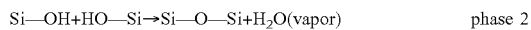 phase 2

Thus, in the deposition phase (phase 1), in addition to silicon oxide, silanol groups are formed within the silicon oxide network. Evidence of these silanol groups has been confirmed using FTIR analysis of the film (see discussion below with reference to FIG. 2). It should be noted that for methods of the invention, the reactants in the deposition phase are not limited to $SiH_4$, $O_2$, and $H_2$. In preferred embodiments, at least a silicon-containing precursor, an oxygen-containing species and a hydrogen-containing species are used. In some embodiments, the oxygen-containing species and a hydrogen-containing species exist in one species, for example, water. While not wishing to be bound by theory, it is believed that hydrogen can suppress the oxidizing capability of the oxidizing agents in the plasma, thereby allowing formation of silanol groups. In general, the more silanol groups are formed in the film, the higher the tensile stress in the resultant film (i.e., after the second phase of treatment). Substrate temperature during deposition can also affect the extent of silanol formation. Thus, one can control the amount of tensile stress in the resultant film by controlling the substrate temperature and the amount of hydrogen in the high density plasma. Note that other process parameters may also be varied to control the extent of silanol formation and will be discussed below.

In the bond reconstruction phase (phase 2), the silanol groups will combine to form bridging oxygen atoms (Si—O—Si) and create water as a byproduct. The water is typically driven off in vapor form during the process of phase 2. While the invention is not limited by this theory, it is generally accepted that tensile stress develops in silicon oxide film from the reduction of the amount of water in the film, and due to shrinkage of voids. The loss of water results in a volume change in the film, but the constraint of the substrate prevents any lateral shrinkage, thus imposing tensile strains in the film. In general, the more water is removed in the second phase, the higher the tensile stress in the resultant film. Thus, one can also control the amount of tensile stress in the film by controlling the extent of bond reconstruction and water removal. The extent of bond reconstruction and water removal can be controlled by varying any of a number of process parameters including substrate temperature, substrate exposure time and the use of a inert gas to suppress water removal. Note that other process parameters may also be varied to control the extent of bond reconstruction and will be discussed below.

A more detailed description of preferred embodiments of the two-phase process will be described below with reference to the flow chart of FIG. 1.

Process

FIG. 1 is a flowchart summarizing a high-level process flow for preparing a high tensile stress oxide in accordance with preferred embodiments of the present invention. This flowchart is representative of some embodiments of the invention and is not intended to encompass all possible embodiments of the invention. The following is a detailed description of the processes outlined in the flowchart.

In the flowchart of FIG. 1, as represented by process block 101, first a partially fabricated integrated circuit is provide in a HDP reactor or chamber. As described above, the partially fabricated integrated circuit is preferably in a FEOL stage of wafer processing, i.e., a stage before deposition of the first metal layer. An example of a suitable HDP reactor is described below with reference to FIG. 6.

Once provided, the substrate is exposed to a high density plasma comprising a silicon-containing precursor, an oxygen source and a hydrogen source to form silicon oxide film with hydroxyl groups incorporated within (block 103). Preferably, a sufficient amount of hydroxyl groups will be formed to ultimately result in a film with a tensile stress of about 1E8 dynes/cm$^2$ or more. However, the amount of hydroxyl groups will preferably not be so great as to critically sacrifice the integrity of the film. It should be noted that because HDP processes are used, process conditions can be tuned to provide films with any stress level, including compressive films, tensile films and zero stress film. Thus, methods of the invention can be used tune the process conditions so as to provide an appropriate amount of tensile stress for a particular need.

As mentioned previously, HDP methods involve the use of high densities of ions that can produce dense, defect free and void free films and are therefore not conventionally well suited for creating silicon oxide films with hydroxyl defects. However, in accordance with the present invention, a number of conditions in a HDP process can be chosen to increase or decrease the likelihood of formation of hydroxyl groups. In general, for HDP methods, hydroxyl formation can increase with decreasing substrate temperature, decreasing low frequency RF (LFRF) source power, decreasing high frequency RF (HFRF) power and increasing substrate to inductive coil distance. In addition, if hydrogen is used as the hydrogen source, increasing amounts of hydrogen can generally lead to increasing amounts of hydroxyl groups in the film. A summary of how these and other process parameters are expected to affect the tensile stress within a silicon oxide film are described below with reference to FIG. 3.

For methods of the invention, it has been found that using substrate temperatures no greater than about 400° C. are preferred. More preferably, substrate temperature between about 25 and about 400° C., even more preferably between about 300 and about 350° C., are used. Preferred LFRF and HFRF source powers will vary depending in large part on the wafer size and process gases. However, it has been found that the HFRF power, which controls the substrate bias and the amount of ion bombardment incident upon the substrate, should be low so as to prevent too much ion bombardment during deposition. Conditions that allow too much ion bombardment can cause the film to revert to a compressive film by adding further Si—O bonds in the film via a bond insertion mechanism. The LFRF power is also preferably low to prevent any possible ion bombardment.

For a 200 mm or 300 mm wafer, the HFRF power is typically no greater than about 8,000 Watts and the LFRF power is typically no greater than about 8,000 Watts. In a typical case where a 200 mm wafer was treated using $SiH_4$ as the silicon-containing precursor source gas, the HFRF power is typically no greater than about 2000 Watts and the LFRF power is typically no greater than about 5000 Watts. In some preferred embodiments, the HFRF power to LFRF power ratio ranges between about ⅓ and about ⅔. The LFRF frequencies will typically range between about 10 KHz and about 2 MHz and the HFRF frequencies will typically range between about 2 MHz and about 27 MHz.

Any suitable reactant gases may be used to deposit the silicon oxide film. In preferred embodiments, the silicon-containing precursor is a silane, such as is $SiH_4$ or $Si_2H_4$. Other possible silicon-containing precursors include suitable carbon-containing silanes such as methyl silanes, dimethyl silanes, and trimethyl silanes. In addition, siloxanes or silanol compounds may be used. Of course, any combination of silicon-containing precursors may also be used. In some preferred embodiments, the oxygen source is $O_2$ and the hydrogen source is $H_2$. In other preferred embodiments, the oxygen source and hydrogen source exist in one species, such as water. Water may also be used in combination with $O_2$ and/or $H_2$. In preferred embodiments where $SiH_4$ and $O_2$ are used, the $SiH_4$ to $O_2$ ratio is between about ¼ and about ⅔. Suitable inert gases include helium, argon, $CO_2$ and $N_2$. It should be noted, however, that in some embodiments, it is preferable that no inert gas is used in addition to the reactant gases (i.e., silicon-containing precursor, oxygen source and hydrogen source). Exposure times to the high density plasma will depend at least in part on the desired thickness of the silicon oxide film. Exposure times will preferably be less than about 420 seconds, more preferably less than about 120 seconds.

In addition to the chemical nature of the plasma and the substrate temperature, it was found that the distance between substrate (wafer pedestal) and the top of the HDP dome also effected the amount of silanol formed in the film. In general, it was found that if this distance was larger, i.e., substrate is farther from the top of the HDP dome, that this condition promoted more silanol formation. Although not wishing to be bound by theory, it is believed that by keeping the substrate relatively far from the densest portion of the plasma, the substrate will experience less ion bombardment and therefore prevent formation/reversion to a compressive film. For example, it has been found that using the on the Speed™ reactor, the larger distances between the top of the pedestal and the gas ring (plasma source) result in producing films with more tensile stress. These results can be seen, for example, in the process control data of FIG. 3 below in which a Novellus Speed™ reactor was used. It has been found that for a 200 mm wafer that the distance is preferably between about 5 inches and about 10 inches and for a 300 mm wafer that the distance is preferably between about 8 inches and about 14 inches.

Returning to FIG. 1, after deposited, the silicon oxide film will next be treated to remove water from and promote bond reconstruction within the film (block 105). Any of a number of suitable methods or combination of methods may be used to remove water from the silicon oxide film, including plasma methods, thermal methods, radiation (e.g., ultraviolet light) exposure methods or a combination thereof. The method will preferably remove a sufficient amount of water to result in a film with a tensile stress of about 1E8 dynes/cm² or more. In preferred embodiments, a high density plasma or a thermal method is used. This is in part because HDP and thermal methods can typically performed in the same chamber as the previous deposition process and will thereby save time.

If a post-deposition HDP treatment is used, the HFRF power will preferably be off or very low so as to prevent ion bombardment of the deposition film. In the same manner stated above for the deposition process, conditions that allow too much ion bombardment can cause the film to revert to a compressive film by adding further Si—O bonds in the film via a bond insertion mechanism. The low frequency (LFRF) power is also preferably low enough to prevent too much ion bombardment but should be high enough to efficiently remove water. For a 200 mm wafer, the LFRF will typically be between about 7000 and 8000 Watts. Treatment times may vary depending upon the LFRF power and substrate temperature. For example, a treatment using a substrate temperature between about 500 and 600° C. and LFRF power between about 7000 and 8000 Watts will typically require a treatment time less than about 60 seconds. A treatment using a substrate temperature no more than about 400° C. and LFRF power between about 7000 and 8000 Watts will typically require a treatment time no more than about 180 seconds. The high density plasma is preferably comprised of inert gas/gases such as helium, argon, $CO_2$, $N_2$ or a combination thereof. In preferred embodiments, the substrate temperature ranges between about 300 and about 800° C.

For embodiments where a thermal process is used to remove water, the substrate temperature preferably ranges between about 300 and about 1000° C. In preferred embodiments, the thermal treatment can occur in an inert environment such as under vacuum or in the presence of an inert gas such as helium, argon, $CO_2$, $N_2$ or a combination thereof. Alternatively, the thermal treatment can occur in the presence of a non-reducing gas, for example in the presence of oxygen. It is preferable that reducing gases, such as hydrogen, not be used since they may react with the film. The use of an inert or non-reducing gas can inhibit the water removal process. While not wishing to be bound by theory, it is believed that the gas lingers and effectively creates a seal over the substrate and reduces water removal efficiency. Oxygen, in particular, has been found to have a relatively strong suppression effect. Thus, one can tune the amount and/or rate of water removal (i.e., tune the amount of stress induced in the film) by controlling the amount of inert or non-reducing gas. The duration of the thermal treatment can vary broadly depending upon substrate temperature, gas pressures, other process conditions and desired resultant film stress. Preferable treatment times are less than about 2 hours, more preferably less than about 1 hour.

After the bond reconstruction/water removal process (105), the tensile stress of the silicon oxide film will preferably be 1E8 or greater, preferably in about the 1E8 to about 1E10 dynes/cm² range. For most FEOL applications, the silicon oxide film is typically deposited to a thickness between about 2,000 Angstroms and about 6,000 Angstroms, more typically between about 3,000 Angstroms and about 5,000 Angstroms. Methods of the invention are not limited to any particular film thickness. However, if a thick silicon oxide film is needed, the deposition and post-deposition treatments (blocks 103 and 105) can be repeated to provide the extra thickness.

It is worth mentioning that after the bond reconstruction/water removal process (105), the silicon oxide resultant silicon oxide film in preferred embodiments has been found to be generally stable and not generally susceptible to re-incorporation of water. Re-incorporation of water, often referred to as hydrolysis, occurs when a film is exposed to ambient and water from the ambient absorbs into the film. Films that are deposited using standard CVD and PECVD methods can be susceptible to hydrolysis since these films are typically not very dense and can more readily allow water to incorporate into the atomic lattice structures. As mentioned previously, the films produced using methods of the present invention can be relatively dense even though they possess high tensile stress.

EXAMPLES

The following examples are presented to help illustrate aspects of the invention. These examples are representative only, and that the invention is not limited by the detail set forth in these examples. In additions, the following examples show process conditions for depositing and treating high tensile silicon oxide films for experimental purposes and may not necessarily represent optimized conditions for depositing films for any particular specific device application.

Figure 2:
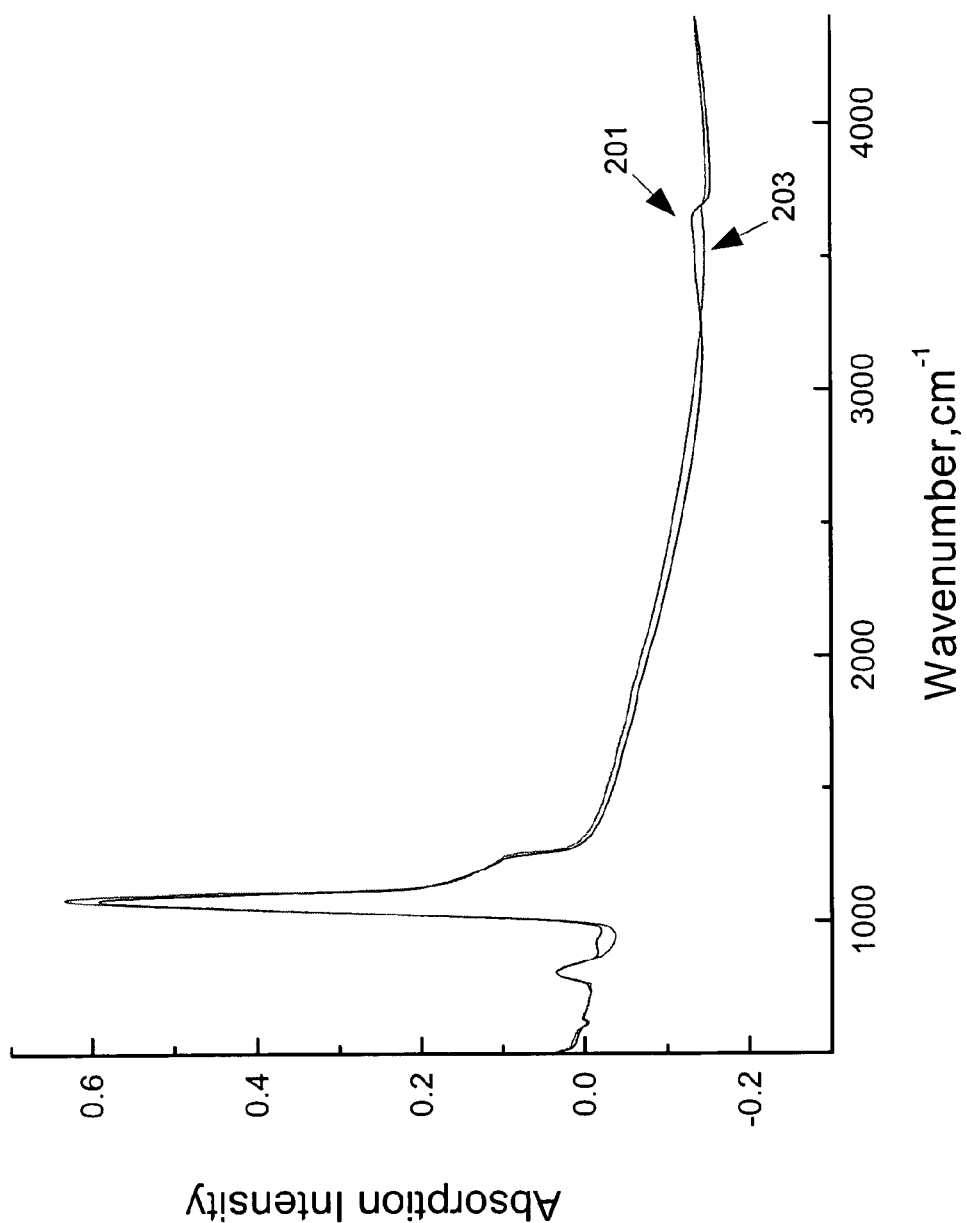
FIG. 2 is a composite FTIR absorption graph showing spectra for a $SiO_2$ film before and after a post-deposition bond reconstruction treatment in accordance with the invention.

FIG. 2 is a composite graph showing two FTIR absorption spectra of silicon oxide films formed using methods of the invention. Spectral line 201 is a silicon oxide film after the first phase, HDP deposition. Spectral line 203 is the same film (line 201 film) after the second phase, post-deposition water removal, using a HDP treatment. The process conditions for the deposition process was: 40 sccm $SiH_4$, 1800 sccm $H_2$, 160 sccm $O_2$, 4,500 Watts LFRF, 500 Watts HFRF, ~300 C substrate temperature, 3.75 cm pedestal height. The process conditions for the post-deposition water removal treatment was: 1,000 He, 7,500 Watts LFRF, ~520 C substrate temperature, 3.75 cm pedestal height.

As shown by spectral line 201, the silicon oxide film prior to the water removal process has a broad peak at around 3500 $cm^{-1}$ to 3800 $cm^{-1}$ corresponding to (Si—OH) bonds in silanol groups within the film. Note that a broad O—H peak from water also exists around 3300 $cm^{-1}$ to about 3500 $cm^{-1}$ which overlaps to a certain extent in with the silanol peak. In addition, a large peak exists at around 1000 $cm^{-1}$ to around 1300 $cm^{-1}$ corresponding to Si—O bonds in the silicon matrix. By measuring and comparing the relative areas under the respective peaks for the Si—OH, O—H and Si—O peaks, a technique commonly used in FTIR analysis, it is calculated that the film contains 4.15% silanol groups. After the water removal process, line 203 shows the broad Si—OH and O—H peaks peak no longer exists. These results indicates that the first deposition phase forms silanol groups (and to some extent water) within the film and the second water removal phase removes the silanol groups (as well as any remaining water).

Figure 3:
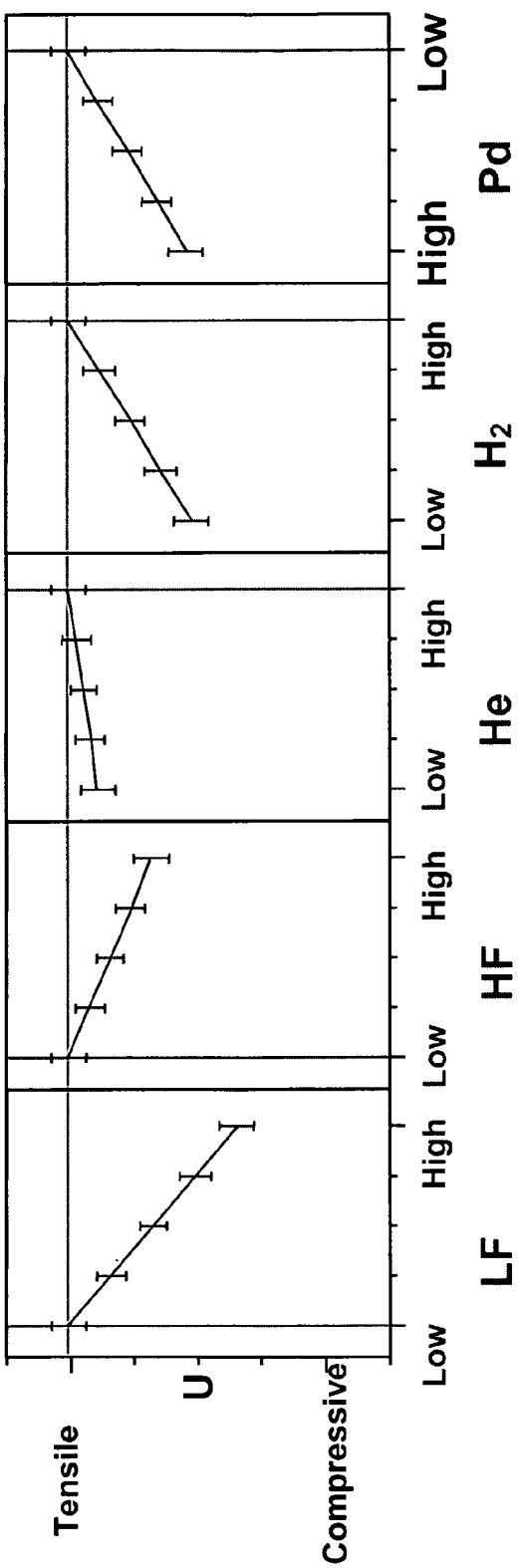
FIG. 3 shows plots depicting the effects of HDP process deposition conditions on tensile stress of the deposited film in accordance with embodiments of the present invention

FIG. 3 is as series of charts showing trends for producing tensile film by varying different process parameters during the deposition process (phase 1). For all sample, a Novellus Speed™ HDP reactor and 200 mm wafer samples were used. The parameters chosen were LFRF power (LF), HFRF power (HF), helium flow rate (He), hydrogen flow rate ($H_2$), and pedestal height (Pd). Pedestal height, as measures on the Speed™ reactor, is the distance between the gas ring, which is the source of the plasma, and the top of the pedestal, which supports the wafer. The higher the pedestal, the closer the substrate will be to the top of the dome and the more ion bombardment experience by the substrate. The LFRF power was varied from 4,500 Watts to 7,500 Watts, HFRF power was varied from 1,000 Watts to 2,500 Watts, He was varied from 100 sccm to 1,000 sccm, $H_2$ was varied from 1,000 sccm to 2,000 sccm, Pd was varied from 1.35 inches (closest to gas ring) to 3.75 inches (farthest from gas ring). The vertical axis of the graph is a relative scale of tensile stress in the films produced using the various conditions. On the vertical axis, films with more tensile stress are above the "U" value, an arbitrary tensile stress value, and films with more compressive stress are above "U". Note that all tensile stress measurements were taken before the bond reconstruction phase (phase 2) and therefore are only used to compare parameters used in the first phase. The upper and lower limits of each bar indicate the standard deviation.

As shown by FIG. 3, tensile stress in the film increased with increasing $H_2$ flow rate and to a lesser extent, increasing He flow rate. As discussed earlier, this is thought to be because the oxidation suppression effects of the $H_2$ and He will encourage formation of silanol groups within the film and thereby produce more tensile stress in the film. Tensile stress in the film increased with decreasing LF, HF and Pd. As discussed previously, higher LF, HF and Pd may contribute an ion bombardment aspect to the treatment, which can revert the film to a more compressive state via bond insertion.

Figure 4:
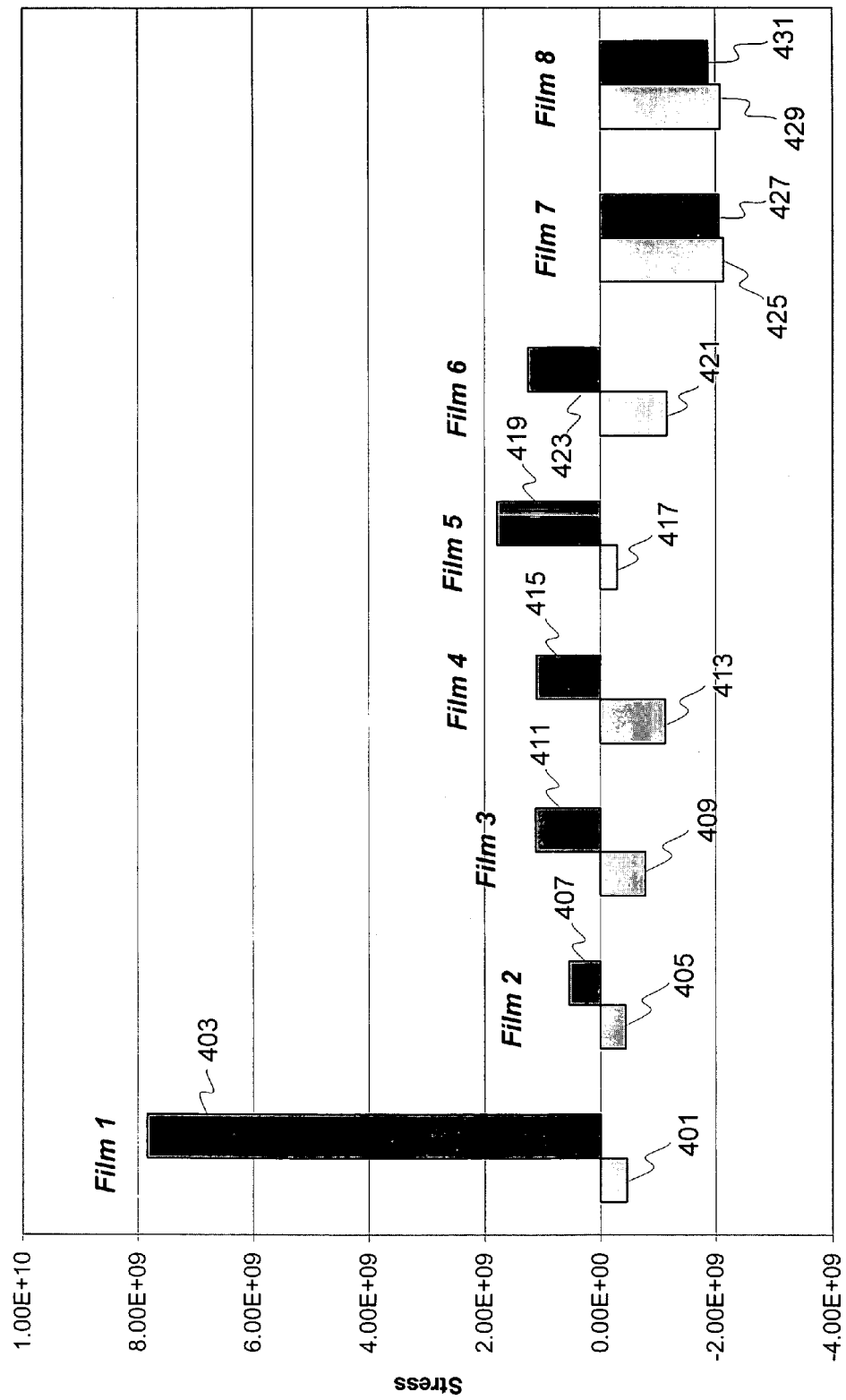
FIG. 4 is a plot depicting process trends for selected HDP process parameters in accordance with embodiments of the present invention.

FIG. 4 is chart showing the tensile stress in films using specific sets of process conditions. Eight film samples were used (label Films 1-8). Each bar represents the tensile stress values for films deposited using one of Deposition A, B, C or Traditional deposition conditions. The deposited films were then all subjected to one of the bond reconstruction treatments BR 1 or BR 2. Deposition A, B, C and BR 1 and BR 2 are in accordance with the present invention. All deposition and bond reconstruction treatments took place in an HDP chamber. All samples were 200 mm size wafers and exposure time for deposition for all films was about 120 seconds. The tensile stress was measured for all film samples before and after a bond reconstruction treatment. Table 1, below, summarizes the process conditions for the depositions and bond reconstruction treatments.

TABLE 1

| Process Name | Bar label (FIG. 4) | $SiH_4$ (sccm) | $O_2$ (sccm) | $H_2$ (sccm) | He (sccm) | HFRF (W) | LFRF (W) | Temp (C.) | Pd (cm) |
|---|---|---|---|---|---|---|---|---|---|
| Deposition A | 401, 403, 405, 407 | 40 | 160 | 1800 | 0 | 1500 | 4500 | 300-350 | 3.75 |
| Deposition B | 409, 411, 413, 415 | 40 | 160 | 1800 | 0 | 500 | 4500 | 300-350 | 3.75 |
| Deposition C | 417, 419, 421, 423 | 40 | 160 | 1800 | 0 | 1000 | 3000 | 300-350 | 3.75 |
| Traditional Deposition | 417, 419, 421, 423 | 17 | 950 | 42 | 0 | 7500 | 4700 | 700-720 | 1.5 |
| BR 1 | 403, 411, 419, 427 | 0 | 0 | 0 | 1000 | 0 | 7500 | 500-520 | 3.75 |
| BR 2 | 407, 415, 423, 431 | 0 | 250 | 0 | 0 | 0 | 7500 | 500-520 | 3.75 |

Table 2 below summarizes the tensile stress values for each of the films before and after bond reconstruction treatments.

TABLE 2

| Film | Bar label | Tensile stress (dynes/cm$^2$) |
| --- | --- | --- |
| Film 1, A dep. | 401 | $-4.59 \times e^8$ |
| Film 1 post BR 1 | 403 | $7.84 \times e^9$ |
| Film 2, A dep. | 405 | $-4.43 \times e^8$ |
| Film 2 post BR 2 | 407 | $5.43 \times e^8$ |
| Film 3, B dep. | 409 | $-7.84 \times e^8$ |
| Film 3 post BR 1 | 411 | $1.12 \times e^9$ |
| Film 4, B dep. | 413 | $-1.13 \times e^9$ |
| Film 4 post BR 2 | 415 | $1.09 \times e^9$ |
| Film 5, C dep. | 417 | $-2.93 \times e^8$ |
| Film 5 post BR 1 | 419 | $1.78 \times e^9$ |
| Film 6, C dep | 421 | $-1.16 \times e^9$ |
| Film 6 post BR 2 | 423 | $1.24 \times e^9$ |
| Film 7, Trad. dep. | 425 | $-2.13 \times e^9$ |
| Film 7 post BR 1 | 427 | $-2.06 \times e^9$ |
| Film 8, Trad. dep. | 429 | $-2.08 \times e^9$ |
| Film 8 post BR 2 | 431 | $-1.87 \times e^9$ |

As shown by FIG. 4, Table 1 and Table 2, the films were deposited using one of Deposition A, B or C (Films 1-6) had higher tensile stress values compared to the films deposited with Traditional Deposition (Films 7-8). This is an expected result since Depositions A, B and C promote silanol group formation, which add tensile stress within the film, while the Traditional Deposition does not. Note also that the tensile stress of the films that deposited using Deposition A, B or C increased dramatically after the bond reconstruction treatments (see 403, 407, 411, 415, 419 and 423) from compressive films (i.e., below 0 dynes/cm$^2$) to tensile films (i.e., above 0 dynes/cm$^2$). The tensile stress of Film 1, in particular, increased from $-4.59 \times e^8$ (401) to $7.84 \times e^9$ dynes/cm$^2$ (403). As shown, 403 which was deposited using Deposition A (HFRF:LFRF ratio of 1:3) and bond reconstruction treatment 1 (with Helium) had significantly more tensile stress compared to the other films. Films deposited using Traditional Deposition (Films 7-8) remain compressive (i.e., below 0 dynes/cm$^2$) even after a bond reconstruction treatment (see 427 and 431). This result indicates that the bond reconstruction treatments are only effective at increasing tensile stress in films that have silanol groups incorporated within.

Applications

As mentioned previously, methods of the invention may be used to produce high tensile stress oxide films in a number of front-end-of-line (FEOL) integrated circuit applications. Using methods of the invention, high tensile films can be deposited in various regions of the device with respect to transistor channel regions to create global strain (uniform strain throughout the device) or local strain (selected regions of strain), as well as uniaxial strain (stress imparted in one surface direction) or biaxial strain (stress imparted in both surface directions). Note that it is generally desirable to impart tensile strain in the channel region of NMOS structures since this increases electron mobility while it is generally desirable to impart compressive stress in the channel region of PMOS structures since this increases hole mobility. Thus, one can choose the placement of the high tensile oxide films to impart tensile and compressive strain in channel regions of NMOS and PMOS transistors to optimize device performance.

Figure 5A:
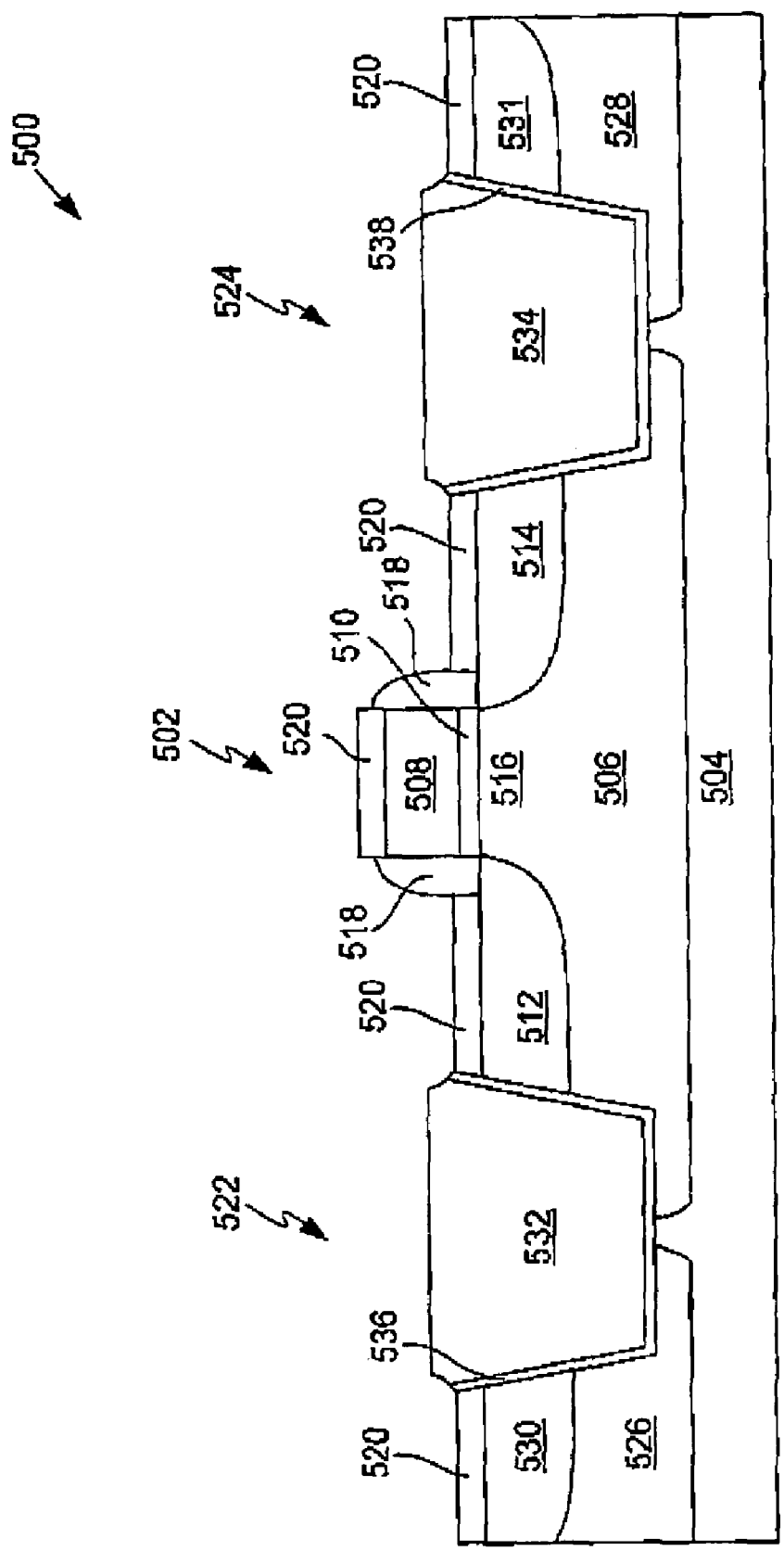
FIGS. 5A-5C depict simple transistor architectures in accordance with embodiments of the present invention.
Figure 5B:
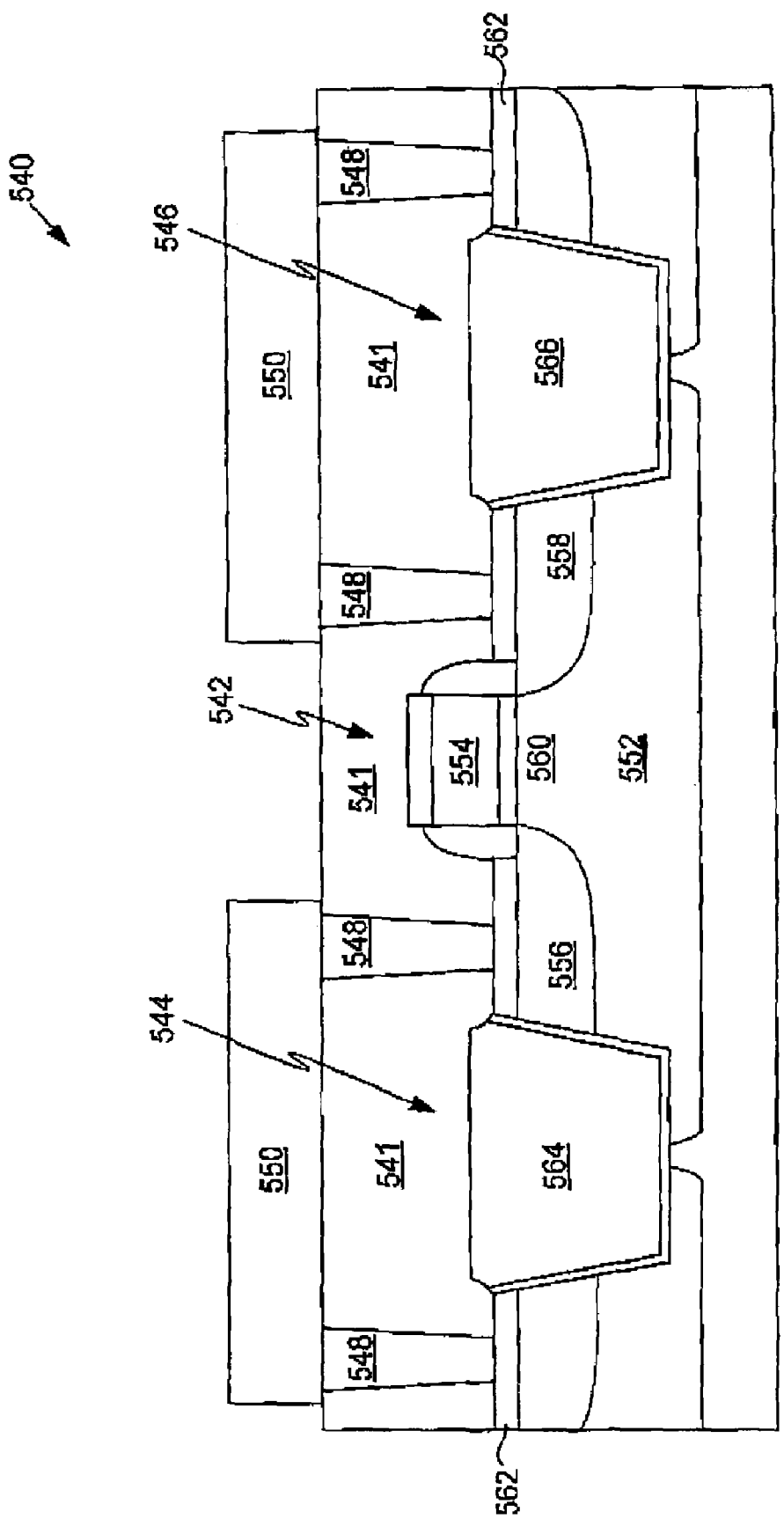
Figure 5C:
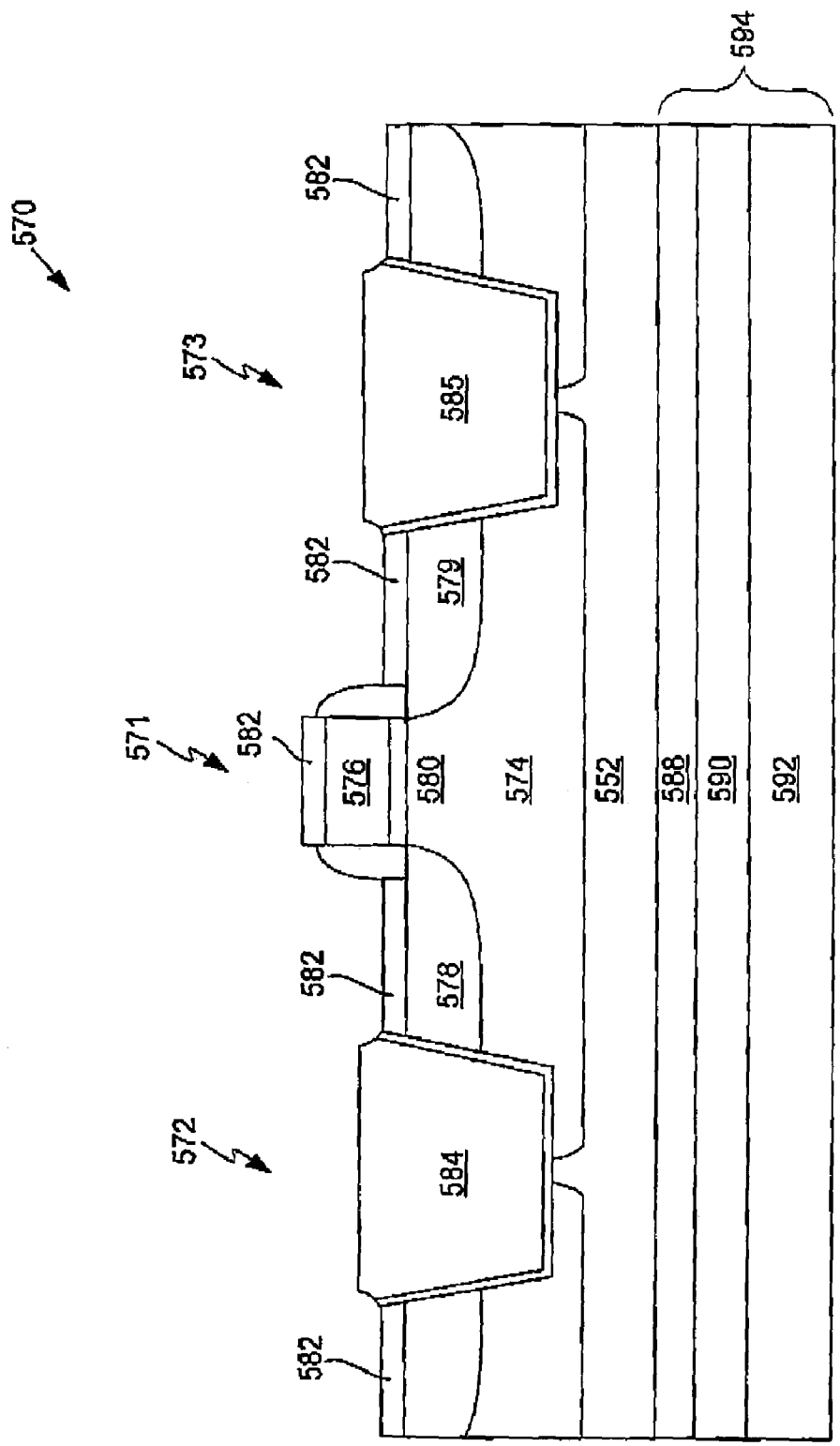

The following description, along with FIGS. 5A-5C, illustrate specific example applications of the present invention. FIG. 5A illustrates a CMOS device with high tensile stress shallow trench isolation (STI) structures, 5B illustrates a CMOS device with high tensile stress pre-metal dielectric (PMD) structures and 5C illustrates a CMOS device with high tensile stress buried oxide in a silicon on insulator (SOI) substrate. The following implementations of high tensile stress oxides may be used alone or in combination. For example, methods of the invention may be used to form one or more high tensile stress STI structures, PMD layers and SOI structures in one device. These example applications are provided to exemplify and more clearly illustrate aspects of the present invention and is in no way intended to be limiting.

FIG. 5A illustrates a simple transistor architecture of CMOS device 500 in accordance with the present invention. The CMOS device 500 has PMOS transistor 502 over epitaxial oxide 504. PMOS transistor 502 is composed of an n-doped well 506, a conductive gate 508 separated from the n-well 506 by a gate dielectric 510, a p-doped source 512 and a p-doped drain 514. A p-type channel region 516 lies under gate 508. There may also be sidewall spacers 518 on gate 508. The source 512, drain 514 and gate 508 are covered with a layer of self-aligned silicide (salicide) 520. Note that in some cases salicide 520 may additionally be covered with a silicon nitride capping layer (not shown). Shallow trench isolation (STI) structures 522 and 524 lie on either side of PMOS transistor 502 and isolate PMOS transistor 502 from wells 526 and 528 and source 531 and drain 530 of adjacent transistor structures. STI structures 522 and 524 comprise high tensile stress oxides 532 and 534, respectively. High tensile stress oxides 532 and 534 were deposited using HDP method in accordance with embodiments of the invention. STI structures 522 and 524 may also have thin thermal oxide trench liners 536 and 538 that were deposited prior to deposition of the high tensile stress oxides 532 and 534. The high tensile stress oxides 532 and 534 of STI structures 522 and 524 tend to compress the cannel region 516, thereby creating compressive strain and promoting increase mobility of holes in the channel region 516.

FIG. 5B illustrates a simple transistor architecture of CMOS device 540 in accordance with the present invention. High tensile stress pre-metal dielectric (PMD) 541 is deposited over NMOS structure 542 and STI structures 544 and 546. PMD 541 comprises high tensile stress oxide and was deposited using HDP methods in accordance with embodiments of the invention. Vias 548 were etched into PMD 541 and filled with conductive material, followed by deposition and etch of a first metal layer 550. NMOS transistor 542 is composed of a p-doped well 552, a conductive gate 554, an n-doped source 556 and an n-doped drain 558. An n-type channel region 560 lies under gate 554. The source 556, drain 558 and gate 554 are covered with a layer of salicide 562. STI structures 544 and 546 are comprised of oxides 564 and 566, respectively. The high tensile stress PMD 541 transfers stress to the channel region 560, via the source 556 and drain 558 regions, creating tensile strain and promoting increase mobility of electrons in the channel region 560.

FIG. 5C illustrates a simple transistor architecture of CMOS device 570 in accordance with the present invention. The CMOS device 570 has NMOS transistor 571 and STI structures 572 and 573. NMOS transistor 570 is composed of a p-doped well 574, a conductive gate 576, an n-doped source 578, an n-doped drain 579 and a n-type channel region 580. The source 578, drain 579 and gate 576 are covered with a layer of salicide 582. STI structures 572 and 573 are comprised of oxides 584 and 585, respectively. NMOS transistor 571 and STI structures 572 and 573 exist over epitaxial oxide 552, which exists over silicon on insulator (SOI) substrate 594. SOI substrate 594 comprises a silicon base 592, a buried oxide 590 and an upper silicon layer 588. Buried oxide 590 comprises high tensile stress oxide and was deposited using methods in accordance with embodiments of the invention. High tensile stress buried oxide 590 transfers stress to channel region 580 creating tensile strain and promoting increase mobility of electrons in the channel region 580.

Apparatus

The present invention is implemented in a high density plasma chemical vapor deposition (HDP-CVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In some embodiments, silicon oxide deposition and treatment occur in one reactor. In other embodiments, a wafer undergoing silicon oxide deposition and treatment is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. Examples of suitable reactors include the Speed™ reactor, available from Novellus Systems of San Jose, Calif., and the Ultima™ reactor, available from Applied Materials, Inc. of Santa Clara, Calif.

Figure 6:
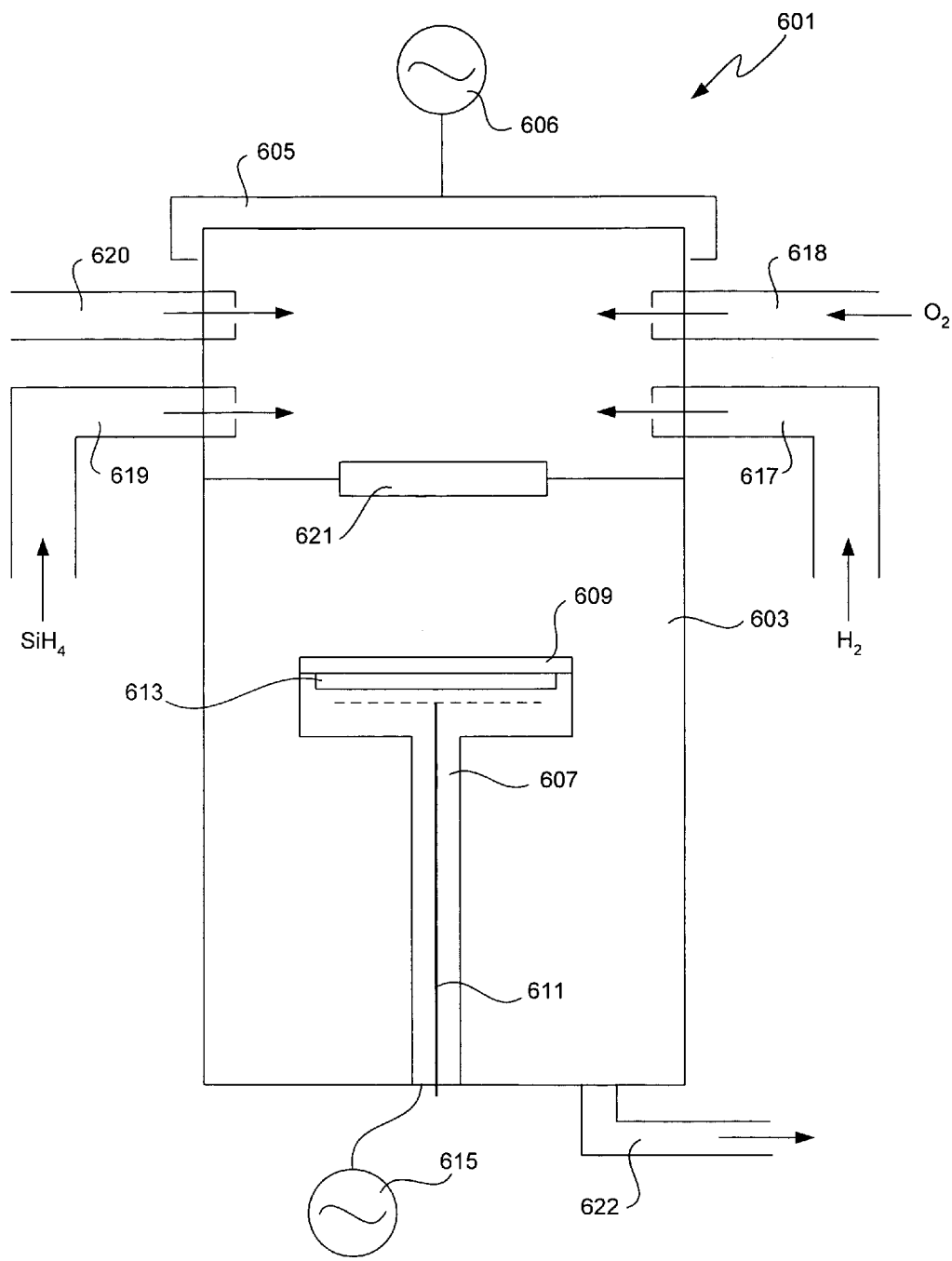
FIG. 6 is a schematic representation of high density plasma apparatus suitable for methods in accordance with embodiments of the invention.

FIG. 6 provides a simple block diagram depicting various reactor components arranged as in a conventional reactor. As shown, a reactor 601 includes a process chamber 603 which encloses other components of the reactor and serves to contain the plasma generated by an electrode 605. In one example, the process chamber walls are made from aluminum, aluminum oxide, and/or other suitable material. Electrode 605 is powered by a "low frequency" RF source 606. The power and frequency supplied by source 606 is sufficient to generate high-density plasma from the process gas.

Within the reactor, a wafer pedestal 607 supports a substrate 609. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 611 for supplying heat transfer fluid controls the temperature of substrate 609. In some embodiments, the heat transfer fluid comprises at least one of helium and argon gas. The heat transfer fluid is supplied to a space 613 between the surface of the substrate and a surface of the chuck. In accordance with the invention, the wafer temperature should be maintained sufficiently cool to facilitate hydroxyl group formation with the silicon oxide film, preferably below about 400° C. The wafer chuck and heat transfer fluid system can facilitate maintaining the appropriate wafer temperatures.

A "high frequency" RF source 615 serves to electrically bias substrate 609 and draw charged precursor species onto the substrate for the deposition reaction. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate, and the radio frequency bias is generated by supplying the electrode with about 5000 W of power.

The process gases, in this case the oxidant(s), are introduced via one or more inlets 617, 618, 619 and 620. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 621, which may or may not direct the gases toward the substrate surface. Injectors may be connected to the primary gas ring 621 to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 603 via an outlet 622. A vacuum pump (e.g., a turbomolecular pump) typically draws process gases out and maintains a suitably low pressure within the reactor.

Reactor pressure is held at a value necessary to sustain the high-density plasma. Preferably the process vessel is maintained at a pressure of at most about 30 mTorr. For many applications, however, the pressure is maintained between about 3 and 20 mTorr; most preferably between about 5 and 20 mTorr. In one embodiment of the invention, the pressure is maintained at about 15 mTorr during the deposition process and about 5 mTorr during the post-deposition treatment.

For a typical apparatus, the low frequency power applied to the upper electrode (for generating the plasma) can typically vary from 1 kW to 20 kW, and the high frequency power (for biasing the wafer) can typically reach at least about 0.1 W/cm$^2$. Note that preferred RF power will depend on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 100 kHz and 27 MHz.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. All references cited herein are incorporated by reference for all purposes.

What is claimed is:

1. A method of forming a silicon oxide film having high tensile stress, the method comprising:
   (a) providing a substrate on a substrate support in a reaction chamber, the reaction chamber capable of maintaining a high density plasma;
   (b) exposing the substrate to the high density plasma using at least a silicon-containing precursor, an oxygen source and a hydrogen source while maintaining a substrate temperature of no greater than about 400° C.

to thereby form a compressive silicon oxide film on the substrate, the silicon oxide film comprising silanol groups; and (c) treating the silicon oxide film to remove at least water from the silicon oxide film, the treating comprising the high density plasma;

wherein a tensile silicon oxide film is formed.

2. The method of claim 1, wherein the silicon oxide film is used as a dielectric in a shallow trench isolation (STI), and/or a pre-metal dielectric (PMD) and/or a silicon-on-insulator (SOI) layer in an integrated circuit device.

3. The method of claim 1, wherein the silicon oxide film has a thickness of between about 2,000 Angstroms and about 7,000 Angstroms.

4. The method of claim 1, wherein the tensile stress of the silicon oxide film after (c) is in about the 1E8 to 1E10 dynes/cm$^2$ range.

5. The method of claim 1, wherein the tensile stress of the silicon oxide film after (c) is about 1E8 dynes/cm$^2$ or greater.

6. The method of claim 1, wherein the high density plasma in (b) further comprises an inert gas.

7. The method of claim 1, wherein the silicon-containing precursor is a silane.

8. The method of claim 1, wherein the silicon-containing precursor is $SiH_4$, the oxygen source is $O_2$ and the hydrogen source is $H_2$.

9. The method of claim 1, wherein the oxygen source and/or hydrogen source is/are water.

10. The method of claim 7, wherein the $SiH_4$ to $O_2$ ratio ($SiH_4:O_2$) is between about 1:4 and about 2:3.

11. The method of claim 1, wherein the substrate temperature in (b) is between about 25° C. and about 400° C.

12. The method of claim 1, wherein the substrate temperature in (b) is between about 200° C. and about 250° C.

13. The method of claim 1, wherein exposing the substrate to the high density plasma in (b) occurs for less than about 420 seconds.

14. The method of claim 1, wherein the substrate is a 200 mm or 300 mm wafer and the high density plasma is formed using a high frequency power of no greater than about 8,000 Watts and a low frequency power of no greater than about 8,000 Watts.

15. The method of claim 1, wherein the substrate is a 200 mm wafer, the silicon-containing precursor is $SiH_4$ and the high density plasma is formed using a high frequency power of no greater than about 2,000 Watts and a low frequency power of no greater than about 5,000 Watts.

16. The method of claim 1, wherein the high density plasma is formed using a high frequency power to low frequency power ratio of between about 1:3 and about 2:3.

17. The method of claim 1, wherein the substrate is a 200 mm wafer and the distance between the substrate pedestal and a top of a HDP dome in the reaction chamber is between about 5 inches and about 10 inches.

18. The method of claim 1, wherein the substrate is a 300 mm wafer and the distance between the substrate pedestal and a top of a HDP dome in the reaction chamber is between about 8 inches and about 14 inches.

19. The method of claim 1, wherein the high density plasma treatment uses a substrate temperature between about 300° C. and about 600° C.

20. The method of claim 1, wherein the substrate is a 200 mm wafer and the high density plasma treatment uses a low frequency power between about 7,000 and about 8,000 Watts.

21. The method of claim 20, wherein the high density plasma treatment uses a substrate temperature between about 500° C. and about 600° C. and the exposure time is less than about 60 seconds.

22. The method of claim 20, wherein the high density plasma treatment uses a substrate temperature between about 300° C. and about 400° C. and the exposure time is between about 120 seconds and about 180 seconds.

23. The method of claim 1, wherein the high plasma treatment includes the use of an inert gas in the high density plasma.

24. The method of claim 23, wherein the inert gas is helium.

25. The method of claim 1, wherein the high density plasma treatment uses a substrate temperature ranging between about 250° C. and about 800° C.

26. The method of claim 1, wherein the treatment in (c) further comprises a thermal treatment.

27. The method of claim 26, wherein the thermal treatment uses a substrate temperature ranging between about 300° C. and about or 1000° C.

28. The method of claim 26, wherein the thermal treatment occurs in an inert environment.

29. The method of claim 26, wherein the thermal treatment occurs in the presence of a non-reducing gas.

30. The method of claim 26, wherein the thermal treatment occurs for less than about 1 hour.

31. The method of claim 26, wherein (c) occurs in a same reaction chamber as (b).

32. The method of claim 1, wherein (c) occurs in the same reaction chamber as (b).

33. The method of claim 1, wherein (c) occurs in a same semiconductor tool as (b).

34. The method of claim 1, wherein an increase in tensile stress of the silicon oxide film after (c) results in a film with a tensile stress up to 7.84 E9 dynes/cm$^2$.

35. The method of claim 1, wherein the tensile stress of the silicon oxide film after HDP deposition in (b) results in a film with a minimum tensile stress of −1.16 E9 dynes/cm$^2$.

* * * * *